United States Patent [19]

Bujese et al.

[11] Patent Number: 4,661,431

[45] Date of Patent: Apr. 28, 1987

[54] METHOD OF IMAGING RESIST PATTERNS OF HIGH RESOLUTION ON THE SURFACE OF A CONDUCTOR

[75] Inventors: David P. Bujese, Butler; Peter J. Calabrese, Kinnelone; Gary W. Schmidt, Park Ridge; Abelardo M. Santos, Englewood, all of N.J.

[73] Assignee: Olin Hunt Specialty Products, Inc., Palisades Park, N.J.

[21] Appl. No.: 848,669

[22] Filed: Apr. 4, 1986

Related U.S. Application Data

[63] Continuation-in-part of Ser. No. 655,346, Sep. 27, 1984, abandoned.

[51] Int. Cl.$^4$ .................... G03G 13/16; G03G 13/22
[52] U.S. Cl. ...................................... 430/126; 430/318
[58] Field of Search ......................................... 430/126

[56] References Cited

U.S. PATENT DOCUMENTS

| | | |
|---|---|---|
| 2,910,351 | 8/1959 | Szpak et al. |
| 3,071,070 | 1/1963 | Matthews et al. |
| 3,075,866 | 1/1963 | Baker et al. |
| 3,650,860 | 3/1972 | Rolker, Jr. |
| 3,758,327 | 9/1973 | York et al. ............ 430/126 X |
| 3,856,519 | 12/1974 | Honjo et al. ............ 430/126 X |
| 3,862,848 | 1/1975 | Marley ............ 430/126 X |
| 4,373,016 | 1/1983 | Kings et al. ............ 430/126 |

FOREIGN PATENT DOCUMENTS 48-38259  11/1973  Japan .................. 430/126

OTHER PUBLICATIONS

Research Disclosure 10802 "Conductive Receiver Sheets" Apr. 1973, pp. 11-13.

*Primary Examiner*—Roland E. Martin
*Attorney, Agent, or Firm*—Ralph D'Alessandro; Thomas P. O'Day

[57] ABSTRACT

An electrostatic latent image in a desired pattern is formed on an electrostatically imageable surface and toned with a liquid toner to form a toner image on the surface. The toner image is then transferred while still wet to a transfer sheet and then to the surface of a conductor, or the toner image may be transferred directly to the surface of a conductor without a transfer sheet, such direct transfer being preferred. The toner image is then fused to the conductor surface to provide an etch resist pattern of high resolution on the conductor surface. The conductor may then be etched to form a high density printed circuit. In the direct transfer method a nonpolar insulating solvent-carrier is applied to the surface of the conductor and the electrostatically imageable surface.

36 Claims, No Drawings

METHOD OF IMAGING RESIST PATTERNS OF HIGH RESOLUTION ON THE SURFACE OF A CONDUCTOR

This is a continuation-in-part application of Ser. No. 655,346 filed Sept. 27, 1984, now abandoned.

FIELD OF THE INVENTION

This invention relates to a novel method of imaging a resist pattern of high resolution on the surface of a conductor and to a novel liquid toner composition for use in that method. The method and liquid toner of the invention are particularly useful in connection with the manufacture of high density printed circuit boards.

BACKGROUND OF THE INVENTION

In the electronics art, it is frequently necessary to apply a resist pattern to the surface of a conductive material, as for example, in the fabrication of printed circuit boards.

A printed circuit board, also known as a printed wiring board, is most commonly fabricated from a base of a suitable insulating material in the form of a rigid or flexible sheet coated with a layer of conductive material (e.g. metal). To fabricate the printed circuit, it is customary to form a resist pattern on the surface of the conductive material in the pattern prescribed by the circuit design, and to then place the board in an appropriate etching solution to remove metal from the areas not covered by the resist pattern. For example, in the case of a rigid phenolic board coated with copper foil: (a) a resist image in the pattern of the desired circuit is first formed as a coating on the surface of the copper foil; (b) the coated surface of the copper foil is then immersed or otherwise contacted with an acid or alkaline etch solution to remove the copper foil layer from those areas of the board not covered by the resist pattern. During the contact with the etch solution, the copper foil layer in the areas covered by the resist pattern is not removed. As a result, after the resist coating is removed from the board, there remains a printed circuit of copper foil in the desired pattern on the phenolic support.

In fabricating printed circuit boards using a resist material, the resist pattern must be accurately formed on the surface of the conductive layer. Any substantial deviation from the prescribed pattern can result in a printed circuit board that does not function in the proper way.

In recent years, at least two factors have combined to make the fabrication of printed circuits in accordance with their specifications an increasingly difficult task. First, the circuits have become more complex and, second, the density of such circuits has increased. These factors have resulted in an ever-increasing need to form resist images of high resolution and precision in connection with the fabrication of printed circuit boards.

Substantial efforts have been devoted in the printed circuit art to develop techniques for applying resist patterns with precision in a commercially practicable manner. Two techniques that have been developed and that have achieved the most commercial success are the screen printing method and the photopolymer resist method.

In the screen printing method, the traditional techniques used in silk-screen printing have been applied to printing an ink resist pattern on a conductor coated on a base of insulator material. Screen printing is low in ink cost, but is disadvantageous in that it requires the costly set-up of a master. Also, the screen printing method has generally only been implemented as a flat-bed process, which requires extensive operator interaction to maintain registration and correct ink viscosity. Additional disadvantages of the screen printing method include limited edge definition of the printed image, relatively poor resolution of the printed image and the necessity for post curing of the printed image. As a result of the foregoing disadvantages, screen printing is typically used only for large production runs of low to medium density printed circuits.

In the photopolymer resist method, the entire metal surface of a metal coated board is first covered with a layer of a suitable photopolymer. The photopolymer may be applied as a liquid which is then dried, or it may be applied in dry-film form. The photopolymer is then exposed to actinic radiation through a photographic mask held against the photopolymer layer and developed to form the desired resist pattern. The photographic mask must be replaced after a certain number of exposures, typically about 20, due to scratching of the mask. This method provides a higher quality resist image than does the screen printing method, but has disadvantages, including the high cost of the necessary materials, the need to replace the mask at regular intervals, and the multiple, time consuming steps necessary to obtain the resist image.

Electrostatic imaging techniques using dry toner have been proposed to overcome the disadvantages of the methods described above. Such techniques, however, have not met with substantial success, at least in part, because of problems in forming high resolution resist patterns on conductor surfaces. For example, such electrostatic imaging techniques have been plagued by low resolution, insufficient resist in the image areas and pin-holes in the resist image.

The problems with electrostatic imaging techniques described in the preceding paragraph have been due, at least in part, to the unavailability of liquid electrostatic toners possessing satisfactory edge-forming, etch resist and wet-transfer characteristics. For example, known liquid toners are capable of forming high resolution images on an absorbent substrate, such as paper, but such images generally may not be transferred to another substrate since they tend to be absorbed into the first substrate. Moreover, even if they were capable of transfer from an absorbent substrate, images produced using the known liquid toners, to our knowledge, are not sufficiently resistant to etching solutions to be useful in the fabrication of printed circuits. Also, attempts have been made in conventional electrophotographic processes to transfer a liquid toned image from a photoconductive surface onto a nonabsorbent substrate such as plastic. Such attempts have been characterized by problems with smearing and running of the transferred image.

Attempts to transfer a dry toner image directly from a photoconductive surface to a conductor in conventional electrophotography have likewise been met with problems, particularly in achieving good resolution of the transferred image. For example, one source of the problems with these attempts has been the tendency of the toner particles employed to take on the same charge as the conductor and, consequently, being repelled by the conductor surface. Attempts to use a thin film of insulating liquid to facilitate the transfer of the toner image to the surface of a conductor similarly have had problems because the toner has tended to be dispersed in the insulating liquid. See U.S. Pat. No. 4,444,858 at col. 2, lines 4-9 and col. 4, lines 61-65 concerning the foregoing problems.

SUMMARY OF THE INVENTION

The present invention is directed to a method of imaging a resist pattern of high resolution on the conductor surface of a conductor laminate and to a liquid toner having superior edge-forming, etch resist and wet-transfer characteristics for use in that method.

In a first embodiment, the method of the invention comprises:

(a) forming an electrostatic latent image in a desired pattern on an electrostatically imageable surface;

(b) toning the electrostatic latent image with a liquid toner to form a toner image in the desired pattern on the electrostatically imageable surface;

(c) transferring the toner image while still wet, in a first transfer step, from the electrostatically imageable surface to a transfer sheet;

(d) transferring the toner image, in a second transfer step, from said transfer sheet to the conductor surface of a conductor laminate; and (e) fusing the toner image to the conductor surface.

In the first embodiment, we prefer to coat the conductor surface of the conductor laminate with a film of a nonpolar insulating solvent. Also, we prefer to maintain an electric field between the conductor surface and the transfer sheet during the second transfer step to facilitate the transfer of the toner image from the transfer sheet to the conductor surface. This may be accomplished by applying a transfer potential in the form of a DC voltage to the conductor relative to a backing electrode positioned adjacent the non-image bearing side of the transfer sheet. In addition, in the first embodiment, we prefer to use a transfer sheet made of a flexible material.

In a second embodiment, steps (a) and (b) are conducted as above. Then, the toner image formed in step (b) is transferred from the electrostatically imageable surface directly to the conductor surface. Thereafter, the toner image is fused to the conductor surface. The transfer step is facilitated by creating an electric field between the conductor surface and the electrostatically imageable surface simultaneously with placing those surfaces into close proximity to each other. In this second embodiment for plating resist applications, especially, we prefer to coat the conductor surface with a water soluble polymer film before the toner image is transferred to the conductor surface. The water soluble polymer film is selectively removed from the non-image areas of the conductor surface after the toner image is fused to that surface.

We believe that the method of the invention may be used in the manufacture of high density printed circuits for use in printed circuit boards. More particularly, we believe that the invention offers a practicable method for forming high resolution resist patterns of the type that have been increasingly required in recent years in connection with the manufacture of printed circuit boards.

The present invention is also directed to a novel liquid toner for use in the method of the invention. The liquid toner comprises an alcohol insoluble maleic modified rosin ester, a linear polyolefin, an amphipathic polymer, a copolymer of ethylene with a monomer selected from the group consisting of acrylic acid, the alkyl esters of acrylic acid, vinyl acetate and combinations thereof, and a phthalocyanine pigment dispersed in a nonpolar insulating solvent-carrier. In a preferred embodiment, the liquid toner further comprises carnauba wax and a solvent-carrier.

The liquid toner of the invention is characterized by a combination of desirable edge-forming, resist and wet-transfer characteristics. Because of the edge-forming ability of the liquid toner, high resolution images having sharp smooth edges may be formed. The resist characteristics of the liquid toner permit the use of relatively thin resist image coatings as compared to conventional resist coatings. Moreover, the resulting resist image coating is resistant to both acid and alkaline etch solutions. Because of the wet-transfer characteristics of the liquid toner, the high resolution of the toner image is not lost upon transfer of the toner image to and from the transfer sheet used in the first embodiment of the invention nor upon direct transfer of the toner image to the conductor surface in the second embodiment of the invention.

DETAILED DESCRIPTION OF THE INVENTION

In the practice of the invention, an electrostatic latent image of the circuit to be reproduced is first formed on a suitable electrostatically imageable surface. Techniques for applying electrostatic latent images to an electrostatically imageable surface are known in the art. For example, when the electrostatically imageable surface is a photoconductor, the surface may be charged, such as by corona discharge, and then selectively discharged by exposure to actinic radiation.

The electrostatic latent image thus formed is toned by applying a suitable liquid toner to the electrostatically imaged surface. During the toning step, solids dispersed in the toner are deposited and retained on the charged image areas of the surface, but not on the uncharged background areas. Methods of applying liquid toner to an electrostatically imaged surface that have been used in the electrophotographic art may be used in the present invention. For example, the electrostatically imaged surface may be immersed in the liquid toner or it may be contacted with a roller carrying the liquid toner.

After the toning step, in a first embodiment of the invention, the toner image is transferred to a transfer sheet in a first transfer step. An electrostatic charge may be applied to the back of the transfer sheet using, for example, a transfer corona, to assist in the first transfer step by creating an electric field between the transfer sheet and the imaged surface. As set forth in the examples, we have found that a modified liquid toner office copier may be used to accomplish the first transfer step, although other means can be used.

Transfer sheets suitable for use in the invention include any dielectric sheet material. Preferably, the sheet material is flexible and exhibits low absorbency towards the solvent-carrier present in the liquid toner. If the solvent-carrier is absorbed by the transfer sheet to a large extent, then the toner image carried by the transfer sheet tends to dry too quickly. Such drying can detract from the quality of the image transferred in the second transfer step described below.

The transfer sheet preferably should be flexible to provide for ease in handling the sheet during the first and second transfer steps of the method. Preferred materials for the transfer sheet are plastic materials compatible with the solvent-carrier present in the liquid toner. Most preferred is a polyester material. The preferred thickness of the transfer sheet is from about 3 mils to about 4 mils. In a preferred embodiment, the surface of the transfer sheet to which the toner image is transferred is slightly roughened.

To facilitate the second transfer step described below, the toner image is neither fused to the transfer sheet nor permitted to dry on the transfer sheet to a significant extent. We have found that when using a polyester transfer sheet, the second transfer desirably should be accomplished within about 1 to about 2 minutes from completion of the first transfer to i minimize drying of the toner image between two transfer steps. For transfer sheets that are more absorbent than polyester, this time would tend to be less than 1 to 2 minutes.

The second transfer step involves transferring the toner image from the transfer sheet to the conductor surface of a conductor laminate. It is preferred that the conductor surface be prepared to accept the toner image from the transfer sheet. This may be accomplished by first cleaning the conductor surface mechanically or chemically to remove any oxide film that has formed on the conductor surface. The conductor surface may be cleaned mechanically by a conventional wet abrasion method and chemically by immersion in sulfuric acid.

Cleaning of the conductor surface preferably is followed by wetting that surface with a nonpolar dielectric solvent. The dielectric solvent that is used in the wetting step should have a suitable evaporation rate. If the evaporation rate of the solvent is too high, the solvent film that is formed during the wetting step may be lost too quickly. On the other hand, if the evaporation rate is too low, the solvent may cause spreading of the toner image with attendant loss of the image's resolution. The solvent should preferably have a high resistivity and low viscosity to permit the charged toner solids to flow through the solvent from the transfer sheet to the conductor surface. The preferred solvents for wetting the conductor surface are Isopar G and Isopar H, manufactured by the Exxon Corportion, Isopar G being most preferred. Isopar G comprises $C_9$–$C_{11}$ branched aliphatic hydrocarbons, while Isopar H comprises $C_9$–$C_{12}$ branched aliphatic hydrocarbons.

The dielectric solvent may be applied by sponge, squeegee, rubber roller or other means capable of applying a thin continuous film of solvent (e.g., a film having a thickness of about 1 mil) to the conductor surface. Applying more than a thin film of solvent may cause spreading of the toner image during transfer with a resultant loss of image resolution.

After the dielectric solvent is applied to the conductor surface, the toner image is transferred from the transfer sheet to the conductor surface in a second transfer step. This is accomplished by placing the transfer sheet onto the conductor surface with the toner image on the transfer sheet facing the conductor surface.

An electric field is preferably maintained between the conductor surface and the transfer sheet to electrophoretically assist in the transfer of the toner image from the transfer sheet to the conductor surface. This may be accomplished, for example, by applying a transfer potential to the conductor relative to a backing electrode positioned adjacent the non-image bearing side of the transfer sheet. A very light pressure is preferably applied to the transfer sheet (e.g., by using a roller) to facilitate the transfer of the toner image to the conductor surface. The application of a transfer potential in this manner, together with the application of light pressure, results in the image being transferred from the transfer sheet to the conductor surface in a short period of time (i.e., in a fraction of a second). After transfer, the transfer sheet is peeled from the conductor surface leaving a high quality, high resolution toner image on the conductor surface.

The transfer potential applied to the conductor during the second transfer step should preferably range from about 500 to about 3500 VDC. If less than the optimum voltage is used, the overall quality of the transferred image is adversely affected by insufficient fill-in of the image areas. On the other hand, too much voltage tends to produce voids in the transferred image. Accordingly, a voltage should be selected which provides complete transfer of the toner image from the transfer sheet to the conductor surface with good fill-in and lack of voids. The optimum voltage applied depends upon a combination of factors such as the composition of the liquid toner used, the characteristics of the conductor surface and the type thickness of the transfer sheet employed.

The backing electrode may be any conductor. In a preferred embodiment of the method, which is described in more detail in the examples below, the backing electrode is in the form of an aluminum roller. In that embodiment, the transfer sheet and the conductor laminate pass between the aluminum roller and a rubber roller. Light pressure is applied to the transfer sheet and conductor laminate by the rollers simultaneously with the maintenance of an electric field between the conductor surface and the transfer sheet in the area of the light pressure. The electric field is created by applying a transfer potential, as described above, to the conductor relative to the aluminum roller.

The pressure applied to the transfer sheet during the second transfer step should be light. If no pressure is applied during the transfer step, then poor quality transfer of the image will tend to result. On the other hand, excessive pressure will tend to cause spreading of the transferred image, resulting in poor resolution.

After the second transfer step, the toner image, which is now on the conductor surface, preferably is permitted to dry in air. This typically takes less than one hour at ambient temperature and permits a substantial portion of the solvent-carrier of the liquid toner to evaporate (i.e., to leave the toner image dry to the touch). After drying, the toner image may be fused to the conductor surface by applying heat. If heat is applied without first evaporating at least a substantial portion of the solvent-carrier, then the solvent-carrier entrained within the toner image on the conductor surface may undergo rapid vaporization, causing "temperature shock", which may adversely affect the resolution of the fused film as well as the resist characteristics of that film. The drying and fusing steps may be combined advantageously by using a "temperature ramp" method. With such a method, temperature is gradually increased over time, which permits rapid drying and fusion while avoiding the effects of temperature shock described above.

The temperature at which the conductor surface is heated during the fusion step is a function of the flow properties of the toner solids. In particular, the temperatures preferably should be sufficient to induce the flow of those solids to facilitate good adhesion and resist characteristics of the fused image. Both the temperature and the duration of heating may be optimized by a person skilled in the art for the particular liquid toner being used. Such temperature and duration may range from about 40° to about 210° C. for about 15 to about 20 seconds.

After the fusion step, the conductor surface, which now bears a resist image corresponding to the desired circuit, may be etched to produce a printed circuit. In the etching step, the etch solution does not remove conductor from the areas of the conductor surface protected by the resist image, but does attack and remove conductor from the areas unprotected by the resist image.

The resist image formed on the conductor surface is preferably a high quality resist suitable for use with both acid and alkaline etching solutions. The particular type of etchant employed depends, in part, on the conductor being etched. For example, when the conductor is copper, an etchant comprising acidic cupric chloride is preferably used.

After etching, the resist may be removed from the conductor surface. This may be accomplished by gently scrubbing the resist with a solvent such as Isopar, acetone or toluene. Isopar solvents, which are branched aliphatic hydrocarbon solvents manufactured by Exxon Corporation, are preferred because they are relatively non-toxic.

The term "conductor laminate" as used herein comprises a conductive material layer bonded to a dielectric substrate. The conductive material may be copper, silver, gold, aluminum, stainless steel, tin, lead, nickel or other materials known to be suitable by those skilled in the art. Copper is the most preferred conductive material because of its good thermal and electrical conductivity in relation to cost as well as its ability to be wetted by solder. Suitable dielectric substrates include vulcanized fiber, mica, glass, asbestos, cotton, glass fiber, polyester, aromatic polyamide, cellulose, aromatic polyimide or mixtures thereof. Preferably the conductive material layer is bonded to the dielectric substrate with a thermosetting phenolic resin, an epoxy resin, or mixtures thereof.

In a second embodiment of the present invention, the toner image is transferred directly from the electrostatically imageable surface to the conductor surface without using a transfer sheet. In this second embodiment, the toner image may be formed on the electrostatically imageable surface as in the first embodiment described above. The transfer is facilitated by maintaining an electric field between the conductor surface and the electrostatically imageable surface. This may be accomplished by applying a charge potential to the conductor surface from a DC transfer corona positioned on the conductor side of the conductor laminate. By positioning the DC transfer corona in this manner, the laminate does not act as a shield between the electrostatically imageable surface and the applied charge potential from the corona which would occur if the corona was positioned on the side of the conductor laminate opposite to the electrostatically imageable surface. Alternatively, the electric field may be maintained by applying a transfer potential to the conductor in the form of a DC voltage. With either method, the conductor of the conductor laminate must be electrically isolated from the metal parts of the imaging apparatus to avoid electrical shorts and electrical shock.

Thus, with a few modifications, a conventional liquid toner office copier could be used to image directly a flexible (i.e., about 2 mil) copper laminate. In particular, the transfer corona in the conventional copier must be moved to the appropriate position, or means for applying a DC voltage to the conductor must be provided. Also, suitable modifications must be made to avoid the electrical shorts and shocks described in the preceding paragraph. With further modification to provide a straight line path for the conductor laminate, thicker, nonflexible conductor laminates may be directly imaged in a modified conventional liquid toner office copier.

When a DC transfer corona is used in the second embodiment, it is used as in a conventional liquid toner office copier, except for the change in location as described above. When a transfer potential in the form of a DC voltage is applied to the conductor, a voltage of 500 to 3500 VDC preferably should be used.

While maintaining the electric field described above, the conductor surface is placed in close proximity to the electrostatically imageable surface to effect the transfer of the toner image to the conductor surface. It is preferred to place the conductor surface as close as possible to the electrostatically imageable surface without contact between them. Before such transfer, the conductor surface of the conductor laminate may be coated with a water soluble polymer film, although a bare copper surface is most preferred. If a polymer film is used, it may be applied as a liquid and then permitted to dry before the transfer step, or it may be applied as a dry film. A preferred water soluble polymer film for this purpose is polyvinyl alcohol.

After the transfer step, the transferred toner image is fused to the conductor laminate as described above in connection with the description of the first embodiment. If the conductor surface has been coated with a water soluble polymer film, then during the fusing step, the toner image fuses with the polymer coating to provide an adhesive, water insoluble, etch resistant image on the conductor surface. Rinsing the conductor surface in water before the etching step removes the water soluble polymer film from the non-image areas, but does not remove the fused toner and polymer film from the image areas of the conductor surface. The conductor laminate, now bearing a resist image in the desired pattern, may be processed in the manner described above in the discussion of the first embodiment to produce a printed circuit. Such processing preferably includes removal of the fused toner and polymer film from the image areas of the conductor surface after the etching step.

The novel liquid toner that is desirably used in the method of this invention comprises a nonpolar insulating solvent-carrier, an alcohol insoluble maleic modified rosin ester, a linear polyolefin, an amphipathic polymer, a copolymer of ethylene with a monomer selected from the group consisting of acrylic acid, the alkyl esters of acrylic acid, vinyl acetate and combinations thereof, and a phthalocyanine pigment.

The solvent-carrier of the liquid toner may be a nonpolar insulating liquid of a type conventionally used in liquid toners. Examples of such solvent-carriers are described in Kosel U.S. Pat. No. 3,900,412 (the '412 patent) the disclosure of which is incorporated herein by reference. It is preferred that the solvent-carrier used in our liquid toner be nontoxic and have low odor, low K.B. (Kauri-butanol) number and low aromatic liquid content as described in the '412 patent, but the lack of these characteristics will not make the solvent-carrier non-functional.

The solvent-carrier preferably used in our liquid toner is characterized by high electrical resistivity and low dielectric constant. Electrical resistivity preferably is on the order of at least about $10^9$ ohm-centimeters, and the dielectric constant preferably is less than three and one-half. The use of a solvent-carrier having these characteristics helps to insure that the liquid toner does not dissipate the pattern of electrostatic charges that are to be toned by the liquid toner.

In another approach using the direct transfer method, both the conductor surface and the electrostatically imageable surface are coated with a nonpolar insulating liquid of the type described as the solvent-carrier. The electrostatically imageable surface is coated, via surface adsorption, during normal development of the latent image. This coating can be accomplished by flooding, dipping or spraying the electrostatically imageable surface. The conductor surface is coated in an appropriate manner, such as by sponging or wicking, with the nonpolar insulating liquid. This nonpolar insulating liquid, which is applied directly to the surface of the conductor, is the aforementioned Isopar G or H, manufactured by Exxon Corporation with a high electrical resistivity and a low viscosity. This liquid serves as the transfer medium through which the charged toner particles flow from the electrostatically imageable surface to the conductor surface. This method of charged toner particle transfer is especially useful in etch resist applications. The liquid is applied to each surface to provide a completely liquid transfer medium of appropriate coating thickness at the point of transfer of the charged toner particles between the electrostatically imageable surface and the conductor surface. The charged toner particles are directed through the liquid transfer medium by the electric field applied at this point of transfer and are transferred to the conductor surface to create imaged areas on the conductor surface where toner particles are present and non-imaged areas where they are absent. Excess solvent-carrier is removed from the non-imaged areas of the conductor surface to prevent the image formed by the charged toner particles in the imaged areas from flowing or bleeding into the non-imaged areas during fusing. The imaged areas with the entrained solvent remain wet.

The toner image formed by the toner particles in the imaged areas is then fused to the conductor surface by heating, either through the use of an oven or an air slot, so that heat is supplied for a finite period of time sufficient to reach the temperature at which the binder or polymer forming the toner particles will solvate in the liquid which is entrained within the transferred image. The fusing, for example, can occur for about 15 to about 20 seconds at a temperature greater than about 100° C. and up to about 180° C. Thereafter the non-imaged areas are etched as described previously. Finally the toner is appropriately removed or stripped from the imaged areas, such as by rinsing with methylene chloride, acetone or other suitable solution.

Typically, the liquid toner used in the process of the invention contains from about 97% to about 99% by weight solvent-carrier. However, in preparing the liquid toner, a concentrate containing about 80% solvent-carrier is first prepared. This concentrate may then be diluted to a "replenishing concentrate" containing about 90% solvent-carrier. Thereafter, the replenishing concentrate is further diluted with solvent-carrier to form a working solution just prior to its use.

In use, the alcohol insoluble maleic modified rosin ester component of the liquid toner functions to modify the electrical characteristics of the toner solids by increasing their electrophoretic mobility and, also, to enhance the ability of the toner solids to form a suitable film. Preferably, this component is a pentaerythritol modified rosin ester that is insoluble in the solvent-carrier of the liquid toner. An example of such a rosin ester that may be used in the invention is Unirez 7059, marketed by Union Camp Corporation, Wayne, N.J. A suitable solvent-carrier for the Unirez 7059 is the previously identified Isopar H.

Preferably, from about 12 to about 21 parts by weight alcohol insoluble maleic modified rosin ester is used in the toner composition per 100 parts by weight of total film solids. As used herein, "total film solids" shall mean the toner solids which remain after evaporation of the solvent-carrier component of the liquid toner. Thus, if all of the solvent-carrier of the liquid toner of the invention was evaporated, preferably from about 12 to about 21% by weight of the solids remaining would be the alcohol insoluble maleic modified rosin ester. The most preferred liquid toner formulation of this invention includes about 17 parts by weight of the modified rosin ester per 100 parts by weight of total film solids.

Suitable linear polyolefins that may be used include those polyolefins having a softening point in the range of about 80° C. to about 130° C. A list of such polyolefins appears in U.S. Pat. No. 4,104,183 (Tsubuko et al.). Here again, the particular linear polyolefin selected preferably should be insoluble in the solvent-carrier of the liquid toner. An example of a suitable linear polyolefin that may be used is AC-Polyethylene 6A manufactured by Allied Corporation. That polyolefin has a softening point of 102° C. and comprises a low molecular weight linear polyethylene.

Preferably, the liquid toner comprises linear polyolefin in an amount from about 9% to about 16% by weight of the total film solids. Most preferably, the linear polyolefin comprises about 12.5% by weight of the total film solids.

As used herein, "amphipathic polymer" means a polymer having a composition to be described below which comprises a first polymeric moiety that is soluble in the solvent-carrier of the liquid toner and a second polymeric moiety that is not soluble in the solvent-carrier. Such amphipathic polymers are described in the previously identified '412 patent.

As described in the '412 patent, an amphipathic polymer may be prepared by selecting a precursor or backbone polymer that is soluble in the solvent-carrier, and a second polymer that is not soluble in the solvent-carrier. An amphipathic polymer having a soluble moiety and a nonsoluble moiety may then be prepared as described in the '412 patent.

Depending on the particular solvent-carrier used in the liquid toner, the soluble moiety that forms part of the amphipathic polymer may be selected from the group consisting of crepe rubber; refined linseed oil, degraded rubber, alkyd resins; polyisobutylene; polybutadiene; polyisoprene; polyisobornyl methacrylate; homopolymeric esters of long chain fatty acids; homopolymeric vinyl alkyl ethers; homopolymers of the $C_4$–$C_{22}$ alkyl esters of acrylic and methacrylic acid having a molecular weight in the range from about $10^3$ to about $10^6$, copolymers of the aforesaid $C_4$–$C_{22}$ alkyl esters with one another; copolymers of one or more of the aforesaid $C_4$–$C_{22}$ alkyl esters with one or more of the methyl, ethyl isopropyl and propyl esters of acrylic and methacrylic acids; copolymers of one or more of the $C_4$–$C_{22}$ alkyl esters of acrylic and methacrylic acids with one or more monomers containing acrylic acid, methacrylic acid, crotonic acid, maleic acid, atropic acid, fumaric acid, itaconic acid, citraconic acid, acrylic anhydride, methacrylic anhydride, maleic anhydride, acryloyl chloride, methacryloyl chloride, acrylonitrile, methacrylonitrile, N-vinyl pyrrolidone, acrylamide and derivatives thereof, methacrylamide and derivatives thereof, hydroxyethyl methacrylate, hydroxyethyl acrylate, hydroxypropyl methacrylate, hydroxypropyl acrylate, dimethylaminomethyl methacrylate, dimethylaminomethyl acrylate, dimethylaminoethyl methacrylate, dimethylaminoethyl acrylate, diethylaminomethyl methacrylate, diethylaminomethyl acrylate, diethylaminoethyl methacrylate, diethylaminoethyl acrylate, t-butylaminoethyl methacrylate, t-butylaminoethyl acrylate, cyclohexyl acrylate, allyl alcohol and derivatives thereof, cinnamic acid and derivatives thereof, styrene and derivatives thereof, butadiene, methallyl alcohol and derivatives thereof, propargyl alcohol and derivatives thereof, indene and derivatives thereof, norbornene and derivatives thereof, vinyl ethers, vinyl esters, vinyl derivatives other than vinyl ethers and vinyl esters, glycidyl methacrylate, glycidyl acrylate, mono- and dimethyl maleate, mono- and dimethyl fumarate, mono- and diethyl maleate and mono- and diethyl fumarate; condensation polymers; copolymers of one or more of butadiene, isoprene and isobutylene with one or more of the $C_4$–$C_{22}$ alkyl esters of acrylic and methacrylic acids, polycarbonates; polyamides; polyurethanes and epoxies.

The nonsoluble moiety of the amphipathic polymer may be selected from the group consisting of the homopolymers and copolymers formed from monomers selected from the group consisting of vinyl acetate, vinyl chloride, methyl acrylate, methyl methacrylate, ethyl acrylate, ethyl methacrylate, propyl acrylate, propyl methacrylate, isopropyl acrylate, isopropyl methacrylate, hydroxy ethyl acrylate, hydroxy ethyl methacrylate, hydroxy propyl acrylate, hydroxy propyl methacrylate, acrylonitrile, methacrylonitrile, acrylamide, methacrylamide, acrylic acid, acrylic anhydride, methacrylic acid, methacrylic anhydride, mono methyl maleate, mono methyl fumarate, mono ethyl maleate, mono ethyl fumarate, styrene, vinyl toluene, maleic acid, maleic anhydride, crotonic acid, crotonic anhydride, fumaric acid, atropic acid, allylamine, vinyl amine, allyl alcohol, vinyl pyridines and derivatives thereof, glycidyl acrylate, glycidyl methacrylate, dialkylaminoalkyl methacrylate, dialkylaminoalkyl acrylate, methacrylyl acetone, N-hydroxymethyl methacrylamides, alkoxymethyl methacrylamides, acryloyl chloride, methacryloyl chloride, vinyl isocyanate, cyanomethylacrylate, vinyl -chloreothylsulfone, vinyl sulphonic acid and vinyl phosphoric acid.

Preferred precursor moieties are polymers having a molecular weight of from about $10^3$ to about $10^6$ made from the $C_4$–$C_{22}$ alkyl esters of acrylic and methacrylic acid, the $C_8$–$C_{18}$ alkyl esters being most preferred. A grafting monomer is preferably also used to provide grafting sites for the nonsoluble moiety. For example, glycidyl methacrylate may be included in the precursor chain and utilized to form grafting sites by methods known in the art.

Preferred nonsoluble moieties include homopolymers and copolymers formed from monomers selected from the group consisting of the lower alkyl esters of acrylic and methacrylic acids and vinyl acetate, the methylmethacrylate monomer being most preferred. As used herein, "lower alkyl" refers to alkyl groups having less than four carbon atoms.

One or more amphipathic polymers are included in the liquid toner in an amount sufficient to provide preferably from about 40% by weight to about 70% by weight of the total film solids of the liquid toner. Most preferably, about 55% by weight of the total film solids is amphipathic polymer.

The liquid toner of the invention also includes a copolymer of ethylene with a monomer selected from the group consisting of acrylic acid, alkyl esters of acrylic acid, vinyl acetate and combinations thereof. Most preferred are copolymers of ethylene with ethylacrylate in which the ratio by weight of ethylene to ethylacrylate is about 3:1. Preferably, from about 8% by weight to about 15% by weight, and most preferably 12.5% by weight, of the total film solids is the ethylene copolymer.

The liquid toner of the invention also includes a phthalocyanine pigment. Most preferred is phthalocyanine green. The pigment preferably should be added to provide from about 3% by weight to about 6% by weight of the total film solids. In the most preferred embodiment, the pigment amounts to about 4.5% by weight of the total film solids.

The liquid toner may also include a dispersion stabilizer comprising a polymer soluble in the solvent-carrier of the liquid toner. Such a dispersion stabilizer may be a polymer corresponding to any of the amphipathic polymer soluble moieties described above. The addition of a dispersion stabilizer alters the electrical characteristics of the liquid toner, most notably the conductivity of the liquid toner. Accordingly, a dispersion stabilizer may be added to adjust the electrical characteristics of the liquid toner to suit the particular toner formulation used and to produce the highest quality toner image. The particular amount to be added may be determined by a person skilled in the art.

As mentioned above, the liquid toner may be prepared initially as a dispersion concentrate. This may be accomplished by any number of methods, one example of which is provided in Example I. The particular method employed should be selected so as to provide a liquid toner having a conductivity suitable for the particular electrostatically imageable surface, toning apparatus and procedure to be employed. The conductivity required for a particular application may be determined by a person skilled in the art. Also, after a liquid toner is prepared, its conductivity may be adjusted. For example, by heating a dispersion of the type disclosed herein, the conductivity of the dispersion may be reduced by promoting a degree of agglomeration of the toner solids. It is preferred, however, that the particle size of the toner solids be maintained in the range of about $0.1\mu$ to about $10\mu$, with most of the particles being in the submicron portion of the range. Particle size may be controlled to a large extent by varying the degree of milling of the dispersion concentrate.

EXAMPLES

Example I

We prepared a liquid toner for use in the method of this invention by first preparing a "predispersion mix". We accomplished this by combining the following in a high speed disperser:

| Raw Material | Amount (grams) | Description |
| --- | --- | --- |
| Isopar H | 1385 | solvent-carrier |
| Unirez 7059 | 483 | alcohol insoluble maleic modified rosin ester |
| Allied AC Polyethylene 6A | 357 | linear polyethylene |
| Allied AC 400 | 168 | ethylene-vinyl-acetate copolymer |
| Allied AC 540 | 168 | ethylene-acrylic acid copolymer |
| phthalocyanine green | 125 | coloring agent-pigment |
| Alkali Blue G | 83 | coloring agent-dye |

We mixed these components at an impeller speed of 8000 RPM for 10 minutes while maintaining the temperature of the mixture between 160° F. and 220° F.

We then added 1953 grams of an amphipathic polymer dispersion prepared as described in Example XI of the Kosel '412 patent, 672 grams of a dispersion stabilizer prepared as described in Example V of the Kosel '412 patent, and 672 grams of additional Isopar H, and continued mixing for 10 minutes at 8000 RPM while maintaining the temperature between 160° F. and 180° F.

Finally, we added 3697 grams of Isopar H, reduced the mixer speed to 1000–2000 RPM, and continued mixing for 30 minutes. During this last step, we maintained the temperature of the mixture between 120° F. and 140° F.

We next prepared a liquid toner concentrate by combining the following in a static attritor-type mill:

| Raw Material | Amount (grams) | Description |
| --- | --- | --- |
| Predispersion Mix | 872 | liquid toner predispersion |
| Carnauba wax | 56 | wax |
| polymer dispersion | 80 | amphipathic polymer dispersion as prepared in Ex. XI of Kosel |
| Neocryl EX 550 | 60 | amphipathic polymer dispersion available from Polyvinyl Chemical Industries, Div. of Beatrice, 730 Main St., Wilmington, Mass 01887 |
| Isopar H | 822 | solvent-carrier |

These components were milled for three hours at 300 RPM and a temperature of about 75° F.

After milling, a portion of the liquid toner concentrate was diluted 1:1 with Isopar H, heated to 142° F. and held there for 30 minutes. We then tested both the heated portion and the unheated portion for optical density and conducitvity:

|  | Optical Density* | Conductivity** |
| --- | --- | --- |
| unheated concentrate | 0.065 | 20,150 pmhos/cm |
| heated concentrate | 0.05 | 11,540 pmhos/cm |

*Both concentrate portions were first diluted to 7% by weight solids by adding a suitable quantity of Isopar H to the concentrate. Test samples were then prepared by dispersing 5 grams of each of the 7% by weight solids diluted portions in 1 liter of Isopar H.
**Both concentrate portions were first diluted to 9% by weight solids by adding a suitable quantity of Isopar H to the concentrate. Test samples were then prepared by dispersing 24 grams of each of the 9% by weight solids diluted portions in 200 cc of Isopar H.

Example II

This example illustrates the embodiment of our invention in which two transfer steps are utilized.

We first mechanically cleaned the copper surface of a copper laminate board using wet abrasion. We then wiped the copper surface with a towel moistened with Isopar G so as to leave a thin film of the solvent on the copper surface.

We next prepared and transferred a liquid toner resist image to a transfer sheet using a modified Savin Model 870 office copier. The modifications included bypassing the fuser heater to prevent fusing of the liquid toner image to the transfer sheet and adjusting the corona voltages as follows: charge corona, 6.8–7 KVDC; transfer corona, 7.4 KVDC; and discharge AC corona, 4.5 KVAC. The liquid toner of Example I was used in the modified copier. As the transfer sheet we used a flexible, surface-treated Mylar (polyethylene terephthalate) polyester sheet 3–4 mils in thickness supplied by Folex Corporation, Fairfield, N.J. The surface of such sheets have a slightly roughened surface texture.

We placed the imaged polyester sheet, image-side down, on top of the previously wetted copper surface of the copper laminate. We then placed a conductive plate on top of the polyester sheet. To the copper of the copper laminate, we applied 2000 VDC while grounding the top conductive plate. We manually applied light pressure to the top plate using a rubber roller. Finally, we removed the transfer potential, removed the backing plate and peeled off the polyester sheet, leaving a high resolution image that upon fusing will yield a pin-hole free etch resist image on the copper surface.

Example III

In this example we used a roller system for more rapid and precise transfer of the toner image from the transfer sheet to the conductor surface. The roller system consisted of an upper aluminum roller in place of the top conductor plate of Example II and a lower Isopar-resistant soft rubber roller located beneath the aluminum roller. This pair of rollers provided light pressure to the transfer sheet and copper laminate when they were passed between the rollers. The pressure applied by the rollers was controlled by moving the aluminum roller up or down relative to the lower rubber roller. The transfer potential of 2000 VDC was applied to the copper of the copper laminate through a stainless steel spring, one end of which we kept in contact with an edge of the copper surface, and one end of which was connected to a voltage source. The aluminum roller in turn was grounded relative to the copper surface through a grounded conductive roller which rolled against the aluminum roller.

The liquid toner used in this example was prepared in a manner similar to that used for the liquid toner of Example I, except that we substituted 242 grams of Epon 1004F, an epoxy polymer marketed by Shell Chemical Company, Div. of Shell Oil Corp., 100 Executive Drive, West Orange, NJ 07052, for the 242 grams of Unirez 7059 that was used in preparing the liquid toner of Example I. The optical density and conductivity of this liquid toner were measured as in Example I and are shown in Table A.

We placed the liquid toner thus prepared in the modified Savin copier and proceeded as in Example II, except that we used the roller system described above to transfer the toner image to the copper surface of the copper laminate. This was accomplished by placing the imaged polyester sheet face down on top of the wetted surface of the copper laminate and rolling the two through the space between the rollers. As the polyester and laminate passed between the rollers, a potential of 2000 VDC was maintained simultaneously with the application of light pressure by the rollers.

The polyester sheet was then peeled from the laminate leaving on the copper surface a resist image of excellent quality having a line/space resolution of 5 mils. After fusing, the copper laminate was etched in an acidic cupric chloride etch bath to obtain a high density printed circuit board.

Example IV

In this example, we used a liquid toner prepared as in Example I, except that we employed DPDA 9169, a copolymer of ethylene and ethyl acrylate marketed by Union Carbide Corporation, in place of the Allied AC 400 and Allied AC 540 ethylene copolymers used in Example I. This yielded a liquid toner with the properties shown in Table A.

When applied to the copper surface of a copper laminate as in Example III, this liquid toner formulation produced a resist image with resolution and resist characteristics comparable to those obtained in Example III.

Example V

In this example we modified the liquid toner of Example I by replacing half of the Unirez 7059 used to make the liquid toner in Example I with an equal amount of Epon 1004F, and by replacing the Allied AC 400 and Allied AC 540 used to make the liquid toner in Example I with equal amounts of DPDA 9169. This yielded a liquid toner with the properties shown in Table A.

When applied to a copper laminate as in Example III, this liquid toner formulation produced a resist image with resolution and resist characteristics comparable to those obtained in Example III.

TABLE A

| Liquid Toner | Optical Density | | Conductivity (pmhos/cm) | |
|---|---|---|---|---|
| | Unheated | Heated | Unheated | Heated |
| Ex. III | 0.08 | 0.07 | 21,370 | 13,780 |
| Ex. IV | 0.08 | 0.07 | 14,740 | 9,480 |
| Ex. V | 0.08 | 0.07 | 15,710 | 9,500 |

What is claimed is:

1. A method of fabricating a printed circuit board from a conductor laminate comprising the steps of:
   (a) forming an electrostatic latent image in a desired pattern on an electrostatically imageable surface;
   (b) toning the electrostatic latent image with a heat fusible liquid toner to form a toner image in the desired pattern on the electrostatically imageable surface;
   (c) transferring the toner image while still wet, in a first transfer step, from the electrostatically imageable surface to a dielectric transfer sheet;
   (d) transferring the toner image, in a second transfer step, from said transfer sheet to the conductor surface of a conductor laminate;
   (e) fusing the toner image to the conductor surface to form a pin-hole free, etch resistant toner image on the conductor surface;
   (f) etching non-image areas of the conductor to remove conductor from said non-image areas; and
   (g) removing toner from the image areas of the conductor surface to obtain a printed circuit board.

2. The method of claim 1 wherein, during the second transfer step, an electric field is maintained between the conductor surface and the transfer sheet by applying a transfer potential in the form of a DC voltage to the conductor relative to a backing electrode said backing electrode being positioned adjacent the non-image bearing side of the transfer sheet.

3. The method of claim 2 further comprising the step of applying a film of nonpolar insulating solvent to the conductor surface prior to said second transfer step.

4. The method of claim 3 wherein the conductor is copper.

5. The method of claim 4 wherein the transfer sheet is plastic.

6. The method of claim 5 wherein the transfer sheet is flexible.

7. The method of claim 6 wherein the transfer sheet is polyester.

8. The method of claim 5 wherein the nonpolar insulating solvent applied to the conductor surface is a solvent-carrier that is also present in the liquid toner.

9. The method of claim 8 wherein the nonpolar insulating solvent is a branched aliphatic hydrocarbon.

10. The method of claim 5 wherein the second transfer step is initiated while the toner image on the transfer sheet is still wet.

11. The method of claim 5 wherein a transfer potential of about 500 to about 3500 volts DC is applied.

12. The method of claim 5 wherein pressure is applied during the second transfer step.

13. The method of claim 1 wherein the toner image is permitted to dry in air on the conductor surface after step (d) and before step (e).

14. The method of claim 13 wherein the toner image is fused by applying heat to that image.

15. The method of claim 14 wherein the toner image is fused by heated it at about 40° C. to about 150° C. for about 15 to 30 seconds.

16. The method of claim 1 wherein the liquid toner comprises:
   (a) a nonpolar insulating solvent-carrier;
   (b) an alcohol insoluble maleic modified rosin ester;
   (c) a linear polyolefin;
   (d) an amphipathic polymer;
   (e) a copolymer of ethylene with a monomer selected from the group consisting of acrylic acid, the alkyl esters of acrylic acid, vinyl acetate and combinations thereof; and
   (f) a phthalocyanine pigment.

17. A method of fabricating a printed circuit board from a conductor laminate comprising the steps of:
   (a) forming an electrostatic latent image in a desired pattern on an electrostatically imageable surface;

(b) toning the electrostatic latent image with a heat fusible liquid toner to form a toner image in the desired pattern on the electrostatically imageable surface;

(c) maintaining an electric field between the conductor surface and the electrostatically imageable surface;

(d) placing the conductor surface in close proximity to the electrostatically imageable surface bearing the toner image to effect transfer of the toner image from the electrostatically imageable surface to the surface of the conductor;

(e) fusing the toner image to the conductor surface of the conductor laminate to form a pin-hole free, etch resistant toner image on the conductor surface;

(f) etching non-image areas of the conductor to remove conductor from said non-image areas; and (g) removing toner from the image areas of the conductor surface to obtain a printed circuit board.

18. The method of claim 17 wherein the electric field is maintained by applying a charge to the conductor surface from a discharge corona positioned on the conductor side of the conductor laminate.

19. The method of claim 17 wherein the electric field is maintained by applying a transfer potential in the form of a DC voltage to the conductor.

20. The method of claim 19 wherein about 500 to about 3500 volts DC is applied to the conductor.

21. The method of claim 17 wherein the toner image is permitted to dry in air on the conductor surface after step (d) and before step (e) is conducted.

22. The method of claim 21 wherein the toner image is fused to the conductor surface by applying heat to the image.

23. The method of claim 22 wherein the toner image is fused by heating it at about 40° C. to about 150° C. for about 15 to about 20 seconds.

24. The method of claim 17 further comprising the steps of applying a water soluble polymer film to the conductor surface step (d), wherein said film is applied as a liquid coating that is dried before step (d), or as a dry film that is left dry prior to step (d), fusing the toner image to the dry polymer film and to the conductor surface in step (d) by applying heat to the image, rinsing the conductor surface with water after step (e) to remove the water soluble polymer film from non-image areas of the conductor surface, and removing the fused toner and polymer film from the image aras of the conductor surface during step (g).

25. The method of claim 24 wherein the water soluble polymer is polyvinyl acetate.

26. The method of claim 24 wherein the toner image is fused to the polymer film and to the conductor surface by applying heat to the image.

27. The method of claim 24 wherein the toner image is fused by heating at about 40° C. to about 210° C. for about 15 to about 30 seconds.

28. The method of claim 17 wherein the conductor is copper.

29. A method of fabricating a printed circuit board from a conductor laminate comprising the steps of:

(a) forming an electrostatic latent image in a desired pattern on an electrostatically imageable surface;

(b) toning the electrostatic latent image with a heat fusible liquid toner which includes a nonpolar insulating solvent to form a toner image in the desired pattern on the electrostatically imageable surface;

(c) applying a nonpolar insulating solvent to the conductor surface of the conductor laminate;

(d) applying an electric field at a point of transfer between the conductor surface and the electrostatically imageable surface;

(e) placing the conductor surface in close proximity to the electrostatically imageable surface bearing the toner image to effect transfer of the toner image from the electrostatically imageable surface to the conductor surface of the conductor laminate to create imaged areas and non-imaged areas on the conductor surface;

(f) fusing the toner image to the conductor surface of the conductor laminate to form a pin-hole free, etch resistant toner image on the conductor surface;

(g) etching the non-imaged areas of the conductor surface to remove conductor from the non-imaged areas; and (h) removing toner from the imaged areas of the conductor surface to expose a printed circuit pattern on the conductor.

30. The method of claim 29 wherein the electric field is maintained at least partially by applying a charge to the conductor surface by a DC transfer corona.

31. The method of claim 30 wherein the DC transfer corona is positioned on the conductor side of the conductor laminate.

32. The method of claim 29 wherein the electric field is at least partially maintained by applying a transfer potential in the form of DC voltage to the conductor.

33. The method according to claim 32 wherein the transfer potential is about 500 to about 3500 volts DC.

34. The method according to claim 29 wherein the toner image is fused to the conductor surface by applying heat to the toner image.

35. The method according to claim 29 wherein the conductor surface is copper.

36. The method according to claim 29 wherein excess nonpolar insulating solvent is removed from the non-imaged areas while the imaged areas remain wet after step (e) and before step (f).

* * * * *

UNITED STATES PATENT AND TRADEMARK OFFICE
CERTIFICATE OF CORRECTION

PATENT NO.   : 4,661,431
DATED        : April 28, 1987
INVENTOR(S)  : Santos et al It is certified that error appears in the above-identified patent and that said Letters Patent is hereby corrected as shown below:

On the Title Page under "United States Patent [19]" delete "Bujese et al" and insert --Santos et al--.

On the Title Page after "[75] Inventors:" delete "David P. Bujese, Butler; Peter J. Calabrese, Kinnelone; Gary W. Schmidt, Park Ridge; Abelardo M. Santos, Englewood, all of N.J." and insert --Abelardo M. Santos, Englewood; Peter J. Calabrese, Kinnelone; Gary W. Schmidt, Park Ridge; David P. Bujese, Butler, all of N.J.--.

In column 5, at line 13 after "to" and before "minimize" delete "1".

In column 16, at line 44 after "is" and before "ap-" delete "1".

Signed and Sealed this

Twenty-ninth Day of December, 1987

Attest:

DONALD J. QUIGG

Attesting Officer       Commissioner of Patents and Trademarks